US012620423B2

(12) United States Patent
Srinivasan et al.

(10) Patent No.: US 12,620,423 B2
(45) Date of Patent: May 5, 2026

(54) CIRCUITS AND METHODS FOR SUB-BANK SHARING OF EXTERNAL INTERFACES

(71) Applicant: Intel Corporation, Santa Clara, CA (US)

(72) Inventors: Archanna Srinivasan, San Jose, CA (US); Arvind Tirumalai, Santa Clara, CA (US); Arch Zaliznyak, San Mateo, CA (US); Gopal Iyer, Milpitas, CA (US); Hon Khet Chuah, Penang (MY); Arun Patel, Toronto (CA); Kok Kee Looi, Penang (MY)

(73) Assignee: Altera Corporation, San Jose, CA (US)

( * ) Notice: Subject to any disclaimer, the term of this patent is extended or adjusted under 35 U.S.C. 154(b) by 334 days.

(21) Appl. No.: 17/560,086

(22) Filed: Dec. 22, 2021

(65) Prior Publication Data

US 2022/0115047 A1      Apr. 14, 2022

(51) Int. Cl.
*G11C 7/10* (2006.01)
*G11C 7/22* (2006.01)

(52) U.S. Cl.
CPC ............ *G11C 7/109* (2013.01); *G11C 7/1063* (2013.01); *G11C 7/1096* (2013.01); *G11C 7/222* (2013.01)

(58) Field of Classification Search
CPC .................................. G11C 7/109; G11C 7/10
USPC ......................................................... 365/191
See application file for complete search history.

(56) References Cited

U.S. PATENT DOCUMENTS

| | | | | |
|---|---|---|---|---|
| 6,331,956 B1 * | 12/2001 | Ooishi | ................. | G11C 29/842 |
| | | | | 365/230.03 |
| 9,024,657 B2 | 5/2015 | Andreev et al. | | |
| 10,854,274 B1 * | 12/2020 | Grenzebach | ............. | G11C 8/08 |
| 11,662,765 B1 * | 5/2023 | Nagarajan | ................. | G06F 1/12 |
| | | | | 713/400 |

(Continued)

FOREIGN PATENT DOCUMENTS

| | | |
|---|---|---|
| WO | 2011153107 | 12/2011 |
| WO | 2018000406 | 1/2018 |

OTHER PUBLICATIONS

"External Memory Interface Intel Agilex FPGA IP User Guide", Intel Corporation, Jul. 9, 2021, pp. 1-326.*

(Continued)

*Primary Examiner* — Muna A Techane
(74) *Attorney, Agent, or Firm* — InventIQ Legal LLP; Steven J. Cahill

(57) ABSTRACT

An integrated circuit includes a first input/output lane comprising first external terminals and first driver circuits. The first driver circuits exchange signals with a first external device through the first external terminals as part of a first external interface. The first input/output lane is part of a sub-bank in an input/output bank that implements at least a part of the first external interface. The integrated circuit includes a second input/output lane comprising second external terminals and second driver circuits. The second driver circuits exchange signals with a second external device through the second external terminals as part of a second external interface. The second input/output lane is part of the sub-bank in the input/output bank that implements at least a part of the second external interface.

20 Claims, 7 Drawing Sheets

(56)　　　　　　References Cited

U.S. PATENT DOCUMENTS

| 2002/0018394 A1* | 2/2002 | Takahashi ................ G11C 7/22 |
| | | 365/230.03 |
| 2013/0173973 A1* | 7/2013 | Abe ....................... G11C 29/44 |
| | | 714/718 |
| 2017/0366468 A1* | 12/2017 | Shoor ................. H04L 47/6245 |
| 2019/0325919 A1* | 10/2019 | Bhargava ............. G11C 7/1078 |
| 2019/0354495 A1* | 11/2019 | Lu ........................... G06F 13/20 |

OTHER PUBLICATIONS

"External Memory Interfaces Intel Agilex FPGA IP User Guide,"
Intel Corporation, Jul. 9, 2021, pp. 1-326.
European Patent Office, Extended European Search Report and
European Search Opinion for European patent application 22202395.4
dated May 10, 2023, pp. 1-11.

* cited by examiner

CIRCUITS AND METHODS FOR SUB-BANK SHARING OF EXTERNAL INTERFACES

FIELD OF THE DISCLOSURE

The present disclosure relates to electronic circuits, and more particularly, to circuits and methods for sub-bank sharing of external interfaces.

BACKGROUND

Many types of integrated circuit (IC) devices, such as programmable logic IC devices and microprocessor IC devices, communicate with one or more external memory IC devices. The memory IC devices may be in the same package, or coupled to the same circuit board, as the programmable logic or microprocessor IC device. IC devices that communicate with external memory devices typically contain memory interfaces that contain input/output pads and related circuitry. Different memory interfaces in the same IC device may require different power supply voltages. Therefore, input/output (IO) pads are often arranged in input/output (IO) banks in order to support the different memory interfaces. Each IO bank may have its own power supply voltage that is independent of the other IO banks in the IC device. IO buffers within the same IO bank may share the same power supply voltage.

DETAILED DESCRIPTION

Figure 1:
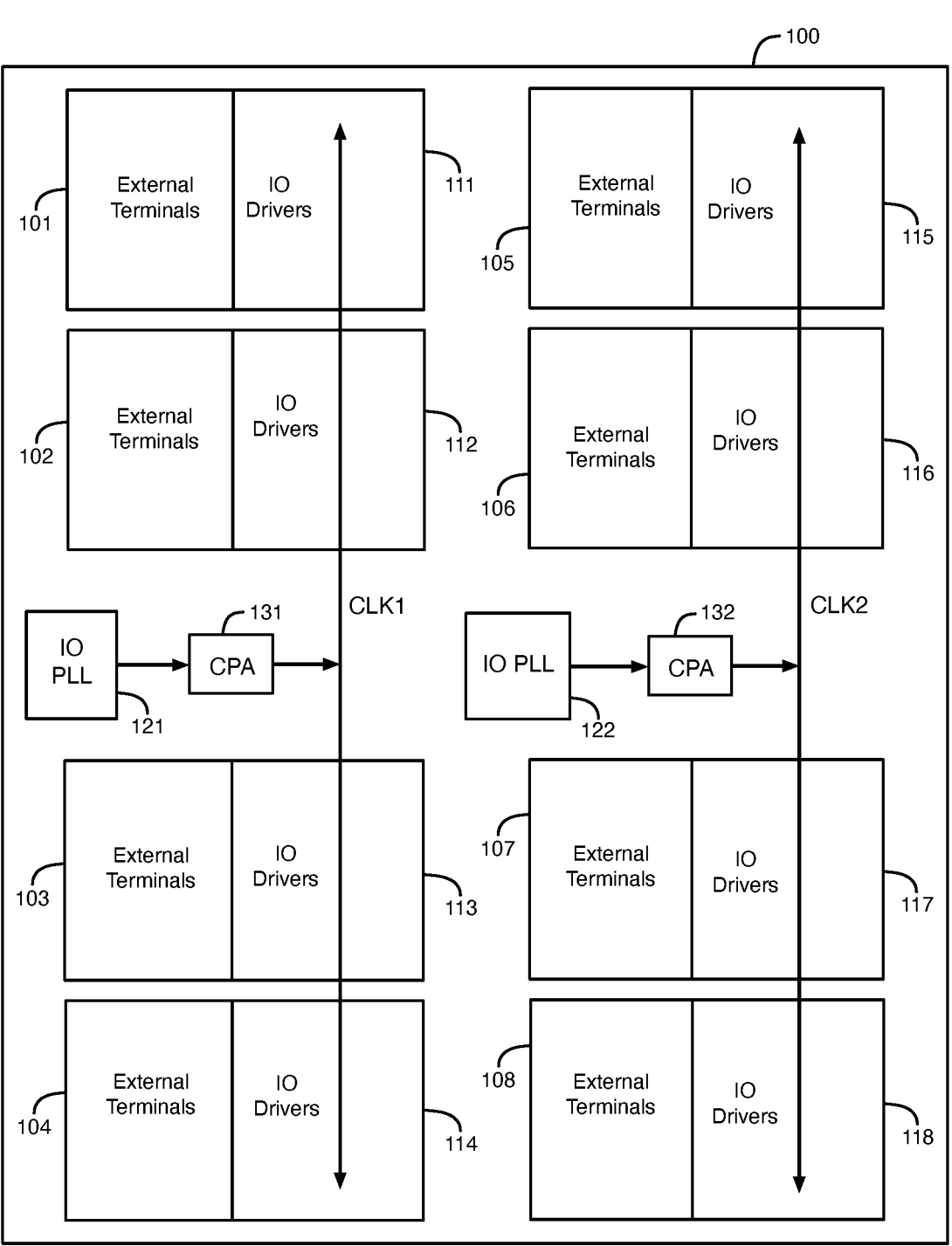
FIG. 1 is a diagram that illustrates an example of an input/output (IO) bank that can be shared between multiple different external interfaces.

One or more specific examples are described below. In an effort to provide a concise description of these examples, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

An integrated circuit (IC) has can only have a limited number of input/output (IO) banks, because of the limitations of the size and the floorplan of the IC die. In the design of each IC, there is often a tradeoff between the number of IO banks in the IC that are used for external memory interfaces, the number of other types of external interfaces, and the cost and die size of the IC. The limited number of input/output banks in an IC die has to satisfy customer requirements for the number and type of external memory interfaces and test features in the IC. In previously known IC dies, each IO bank could only be part of one external memory interface. The external memory interfaces could not be shared to maximize the usage of the external memory interfaces in the IC. Because only one external memory interface could be used for each IO bank, a user of the IC would not be able to support multiple external memory interfaces within a single IO bank. As a result, an IC die could support a fewer number of external memory interfaces.

According to some examples disclosed herein, systems and methods are provided for integrated circuits (ICs) having input/output (JO) banks and sub-banks that support sharing between two or more different external interfaces. An IC may have one or more IO banks. Each of the IO banks may include external IO terminals (e.g., JO pads) and related circuitry coupled to each of the external IO terminals, such as input and output driver circuits. Each of the IO banks in the IC may include two or more sub-banks. Each of the sub-banks may include two or more lanes. Each of the lanes may include a subset of the external IO terminals and the related circuitry in the IO bank. Each of the sub-banks in an IO bank may be part of two or more different external interfaces. As an example, one or more lanes in sub-bank may be used as part of a first external interface to exchange signals with one external device, and one or more other lanes in the same sub-bank may be used as part of a second external interface to exchange signals with a second external device. Because each of the sub-banks in an IO bank can be part of multiple external interfaces, the IC can support more external interfaces with the same number of IO banks. These features allow an IC to have more flexibility and versatility, because the IO banks in the IC can be configured to support different external interfaces for different types of external devices. An IC that allows a sub-bank to be shared with multiple different external interfaces may allow the IC die size to be reduced, may allow more external interfaces to be supported, and may allow for more compact designs of circuit boards, reducing the overall system footprint and cost.

FIG. 1 is a diagram that illustrates an example of an input/output (JO) bank 100 that can be shared between multiple different external interfaces. IO bank 100 shown in Figure (FIG. 1 includes 8 groups 101-108 of external terminals, 8 groups of input/output (IO) driver circuits 111-118, 2 input/output (IO) phase-locked loop (PLL) circuits 121-122, and two clock phase alignment (CPA) circuits 131-132. The IO driver circuits 111-118 are coupled to and in communication with the adjacent external terminals in groups 101-108, respectively. Each of the groups of the IO driver circuits 111-118 exchange input and output signals with a respective group of the external terminals 101-108. Each of the external terminals may be, for example, an IO pad or pin. Each group of external terminals and an adjacent group of IO driver circuits forms an JO lane. As examples, group 101 of external terminals and IO driver circuits 111 form a first IO lane, and group 102 of external terminals and IO driver circuits 112 form a second IO lane. Groups 101-108 of external terminals and the adjacent groups 111-118 of IO driver circuits, respectively, form 8 IO lanes in IO bank 100.

IO bank 100 may, for example, be fabricated in an integrated circuit (IC) die, such as a programmable logic IC, a microprocessor IC, and graphics processing unit (IC), etc. An IC die may, for example, include two or more of the IO banks 100. As a more specific example, an IC die may include 8 IO banks 100. As other examples, an IC die may include 10 IO banks, 12 IO banks, 14 IO banks, etc.

The circuitry in IO bank 100 is arranged into two sub-banks. The first sub-bank in IO bank 100 includes external terminal groups 101-104, IO driver circuits 111-114, IO PLL circuit 121, and CPA circuit 131. IO PLL circuit 121 generates one or more periodic clock signals CLK1 that are provided to CPA circuit 131. CPA circuit 131 provides the clock signals CLK1 to the IO driver circuits 111-114 in the first sub-bank through clock networks. CPA circuit 131 generates phase shifts in the clock signals CLK1 that cause each of the IO driver circuits 111-114 to receive the same delay in the clock signals CLK1. The IO driver circuits 111-114 use the clock signals CLK1 to send and/or receive input/output signals to/from the external terminals in groups 101-104, respectively. The second sub-bank in IO bank 100 includes groups 105-108 of external terminals, IO driver circuits 115-118, IO PLL circuit 122, and CPA circuit 132. IO PLL circuit 122 generates one or more periodic clock signals CLK2 that are provided to the CPA circuit 132. CPA circuit 132 provides the clock signals CLK2 to the IO driver circuits 115-118 in the second sub-bank through clock networks. CPA circuit 132 generates phase shifts in the clock signals CLK2 that cause each of the IO driver circuits 115-118 to receive the same delay in the clock signals CLK2. The IO driver circuits 115-118 use the clock signals CLK2 to send and/or receive input/output signals to/from the external IO terminals in groups 105-108, respectively.

Figure 2:
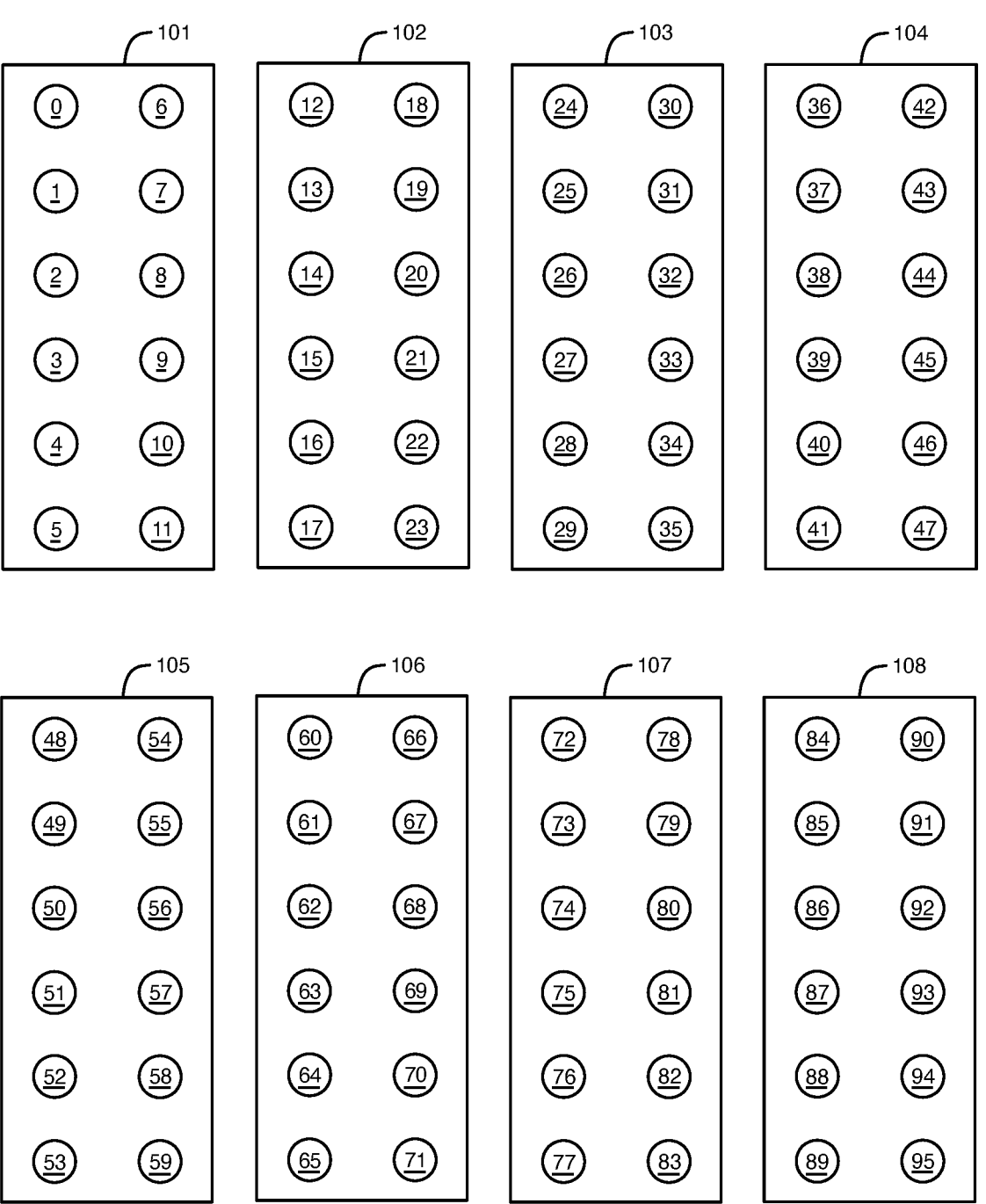
FIG. 2 is a diagram that illustrates examples groups of external terminals shown in FIG. 1 that are part of a sub-bank in an IO bank.

FIG. 2 is a diagram that illustrates examples of the 8 groups 101-108 of external terminals shown in FIG. 1 that are part of IO bank 100. In the example of FIG. 2, each of the groups 101-108 of external terminals shown in FIG. 2 includes 12 external terminals, such as 12 input/output (TO) pads or pins. Thus, the groups 101-108 have a total of 96 external terminals (i.e., 9610 terminals) that are numbered 0-95 in FIG. 2, as an example. Although 12 external terminals are shown in each of the groups 101-108 of external terminals as an example, it should be understood that each of the groups 101-108 shown in FIGS. 1-2 may include any suitable number of external terminals.

IO lane 101 includes external terminals 0-11. IO lane 102 includes external terminals 12-23. IO lane 103 includes external terminals 24-35. IO lane 104 includes external terminals 36-47. IO lane 105 includes external terminals 48-59. IO lane 106 includes external terminals 60-71. IO lane 107 includes external terminals 72-83. IO lane 108 includes external terminals 84-95. Each of the external terminals in each of the IO lanes 101-108 may, for example, be coupled to an input driver circuit and/or an output driver circuit in a respective one of the IO drivers 111-118 shown in FIG. 1. Each of the external terminals 0-95 may be used to transmit and/or receive one or more signals between the IC containing IO bank 100 and one or more external devices.

Figure 3:
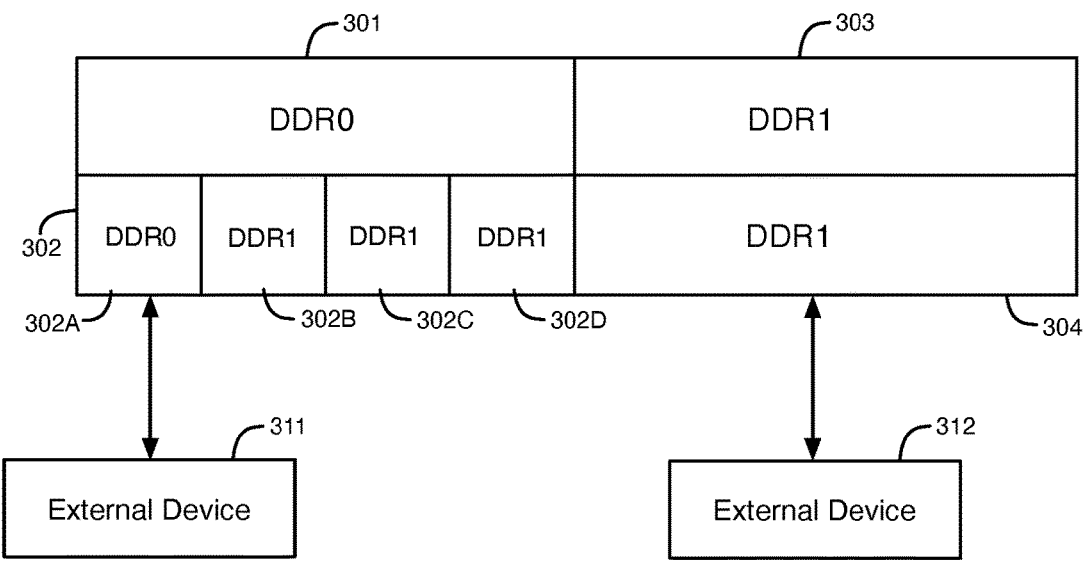
FIG. 3 is a diagram that illustrates examples of input/output (IO) banks having sub-banks that can be shared between two or more external interfaces.

FIG. 3 is a diagram that illustrates examples of two input/output (IO) banks having sub-banks that can be shared between two or more external interfaces. The first IO bank of FIG. 3 includes sub-bank 301 and sub-bank 302. The second IO bank of FIG. 3 includes sub-bank 303 and sub-bank 304. Each of the sub-banks 301-304 shown in FIG. 3 may, for example, include 410 lanes, such as the IO lanes shown in FIG. 1. In the example of FIG. 3, sub-bank 302 includes 410 lanes 302A-302D. Each of the IO lanes 302A-302D may include 12 external terminals, as shown for example, in FIG. 2, or any other number of external terminals.

Any of the sub-banks 301-304 can be part of one, two, three, or more different external interfaces. In the example of FIG. 3, the external terminals and the IO driver circuits in each of the 4 IO lanes in the sub-bank 301 are part of a first double data rate external memory interface (referred to herein as DDR0) that supports the transmission of data signals with a first external memory device 311. The external terminals and the IO driver circuits in IO lane 302A in sub-bank 302 are also part of the first DDR external memory interface DDR0. Thus, 5 IO lanes in the IO bank that includes sub-banks 301-302 are part of the first DDR0 external memory interface in the example of FIG. 3. The DDR0 external memory interface of FIG. 3 may include, for example, a total of 60 external terminals in sub-bank 301 and in IO lane 302A (e.g., 60 pads or pins).

Also, in the example of FIG. 3, the external terminals and the IO driver circuits in each of the IO lanes in sub-banks 303 and 304 are part of a second double data rate external memory interface (referred to herein as DDR1) that supports the transmission of data signals with a second external memory device 312. The external terminals and the IO driver circuits in three IO lanes 302B, 302C, and 302D in sub-bank 302 are also part of the second DDR1 external memory interface. Thus, 4 IO lanes in sub-bank 303, 4 IO lanes in sub-bank 304, and 3 IO lanes 302B-302D in sub-bank 302, for a total of 11 IO lanes, are part of the DDR1 external memory interface in the example of FIG. 3. The DDR1 external memory interface of FIG. 3 may include a total of 132 external terminals in sub-banks 303-304 and in IO lanes 302B-302D (e.g., 132 pads or pins), with 12 external terminals in each IO lane, as shown for example, in FIG. 2.

According to specific examples, one or both of the DDR0 external interface and/or the DDR1 external interface of FIG. 3 may be a Double Data Rate 4 Synchronous Dynamic Random-Access Memory (DDR4 SDRAM) interface. According to other specific examples, one or both of the DDR0 external interface and/or the DDR1 external interface of FIG. 3 may be a Double Data Rate 5 Synchronous Dynamic Random-Access Memory (DDR5 SDRAM) interface. A sub-bank in an IO bank may include one or more IO lanes that are part of a DDR4 external memory interface and one or more IO lanes that are part of a DDR5 external memory interface. Thus, a single sub-bank of an IO bank may be shared between a DDR4 external memory interface and a DDR5 external memory interface. According to other examples, a sub-bank in an IO bank may be shared between two or more external interfaces that may implement any of the following data transmission protocols, such as low-voltage differential signaling (LVDS), DDR4×72 (compact or non-compact), DDR4×64, DDR4×40, DDR×16, DDR×8, and/or any type of DDR5.

Figure 4:
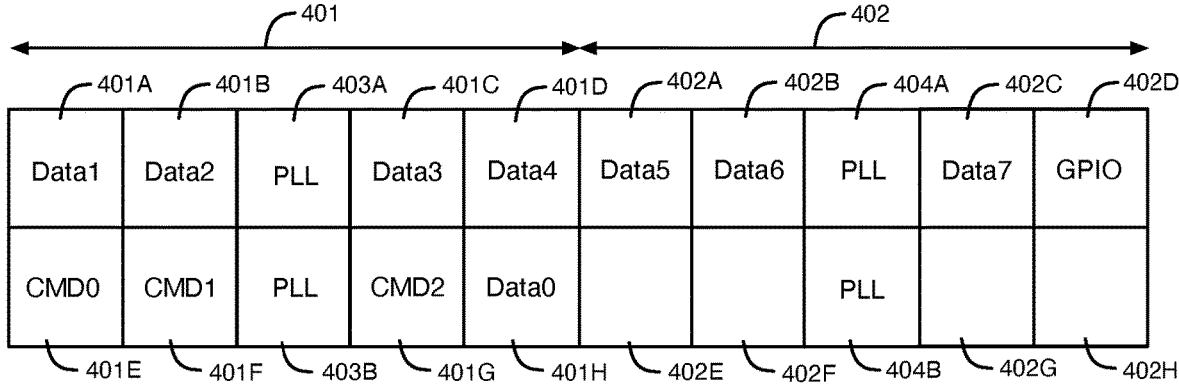
FIG. 4 is a diagram that illustrates other examples of input/output (IO) banks having sub-banks that can be shared between two or more external interfaces.

FIG. 4 is a diagram that illustrates other examples of input/output (IO) banks having sub-banks that can be shared between two or more external interfaces. In the example of FIG. 4, a first IO bank (shown by arrow 401) includes IO lanes 401A-401H and phase-locked loop (PLL) circuits 403A-403B, and a second IO bank (shown by arrow 402) includes IO lanes 402A-402H and PLL circuits 404A-404B.

The first JO bank 401 includes a first sub-bank that comprises IO lanes 401A-401D and a second sub-bank that comprises IO lanes 401E-401H. The second IO bank 402 includes a first sub-bank that comprises IO lanes 402A-402D and a second sub-bank that comprises IO lanes 402E-402H.

Any of the sub-banks in IO banks 401-402 can be part of one, two, three, or more different external interfaces. In the example of FIG. 4, the external terminals and the IO driver circuits in each of the 11 IO lanes 401A-401H and 402A-402C are used as part of a first external interface, and the IO lane 402D in bank 402 is used as part of a second external interface. As an example, the IO lanes 401A-401H and 402A-402C may be part of a double data rate (DDR) external memory interface that supports the transmission of data signals with an external memory device. IO lanes 401H, 401A, 401B, 401C, 401D, 402A, 402B, and 402C are used to exchange data signals Data0, Data1, Data2, Data3, Data4, Data5, Data6, and Data7, respectively, with the external device. IO lanes 401E, 401F, and 401G are used to exchange command signals CMD0, CMD1, and CMD2, respectively, with the external device. The IO lane 402D may be part of a different external interface that has external terminals and associated IO driver circuits that are used to exchange general purpose input/output (IO) signals (GPIO) with a different external device.

The PLL circuit 403A may be used to generate a clock signal for the IO driver circuits in IO lanes 401A-401D. The PLL circuit 403B may be used to generate a clock signal for the IO driver circuits in IO lanes 401E-401H. The PLL circuit 404A may be used to generate a clock signal for the IO driver circuits in IO lanes 402A-402D. The PLL circuit 404B may be used to generate a clock signal for the IO driver circuits in JO lanes 402E-402H.

The sub-bank sharing of external interfaces as disclosed herein can be migrated from one IC die to another IC die. For various design reasons, it may be desirable to substitute a smaller IC die with a larger IC die in an IC package. The sharing of a sub-bank between multiple external interfaces as disclosed herein can be migrated from a smaller IC die to a larger IC die in the same IC package. In an exemplary scenario, sub-bank sharing may be useful to enable optimal DDR memory interfaces.

Figure 5:
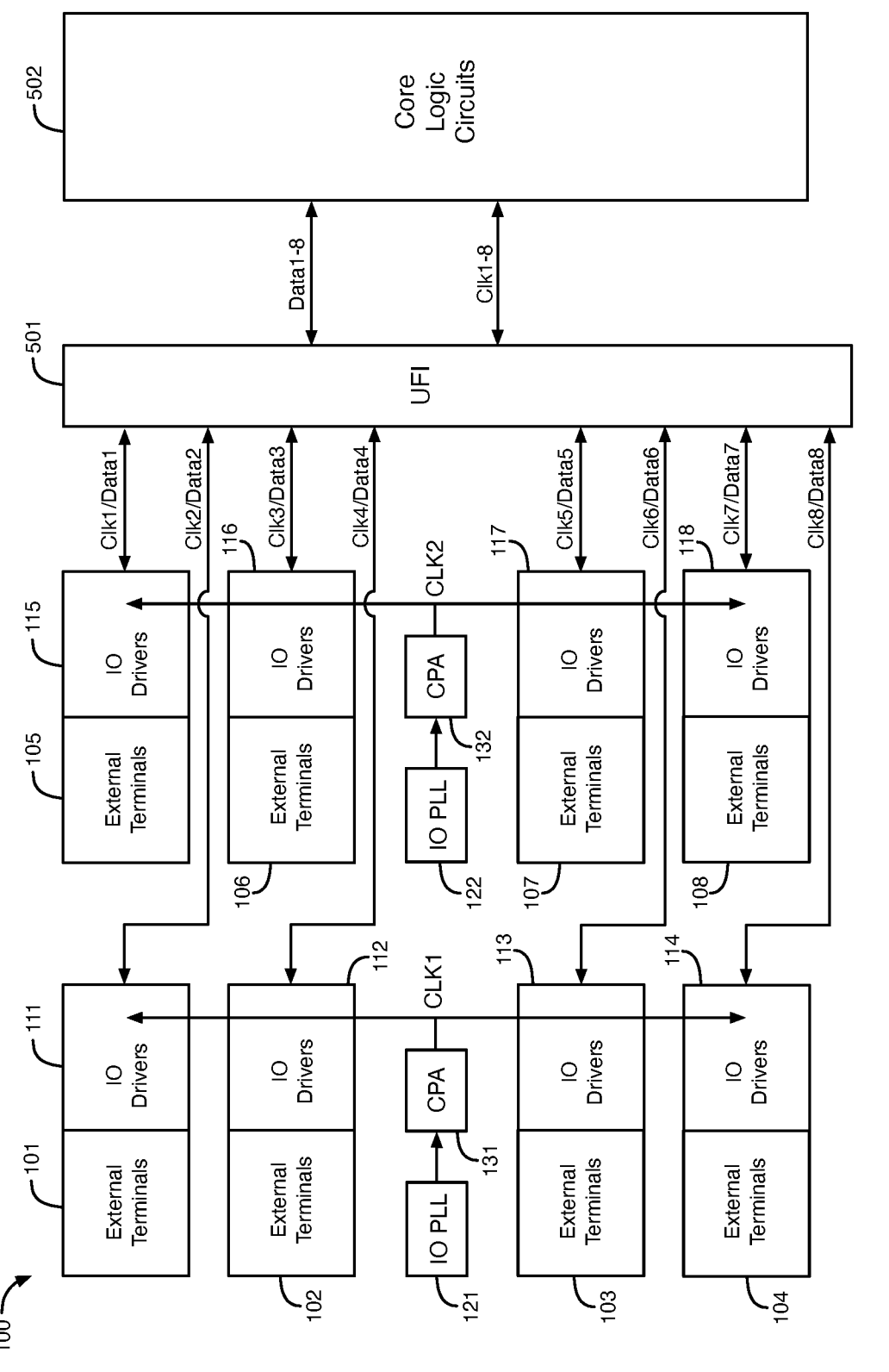
FIG. 5 is a diagram that illustrates an example of a unified fabric interface (UFI) logic circuit.

FIG. 5 is a diagram that illustrates an example of a unified fabric interface (UFI) logic circuit 501. FIG. 5 shows the groups 101-108 of external terminals and the groups 111-118 of the IO driver circuits in the 8 IO lanes of IO bank 100. The IO driver circuits in groups 111-118 may receive data input signals from one or more external devices through the external terminals in groups 101-108, respectively. IO driver circuits 111-114 may receive clock signals CLK1 from CPA circuit 131, and IO driver circuits 115-118 may receive clock signals CLK2 from CPA circuit 132, as described above.

The UFI logic circuit 501 of FIG. 5 is an interface between IO bank 100 and the core logic circuits 502 in the integrated circuit (IC). Data and clock signals may be transmitted from the IO lanes in IO bank 100 to the UFI logic circuit 501. As shown in FIG. 5, data and clock signals Clk1/Data1, Clk2/Data2, Clk3/Data3, Clk4/Data4, Clk5/Data5, Clk6/Data6, Clk7/Data7, and Clk8/Data8 may be transmitted from groups 111-118 of IO driver circuits, respectively, to inputs of UFI logic circuit 501. UFI logic circuit 501 can phase shift the clock signal from each of the IO lanes to align the clock signal with the data signals from the same IO lane. For example, UFI logic circuit 501 may contain registers that delay clock signals Clk1, Clk2, Clk3, Clk4, Clk5, Clk6 Clk7, and Clk8 to be phase aligned with data signals Data1, Data2, Data3, Data4, Data5, Data6, Data7, and Data 8, respectively. UFI logic circuit 501 then transmits the data signals Data1-8 and the phase aligned clock signals Clk1-8 to core logic circuits 502. Core logic circuits 502 may include, for example, programmable logic circuits, memory circuits, and/or digital signal processing (DSP) circuits.

UFI logic circuit 501 handles two-way transfers of data and clock signals between the IO lanes in IO bank 100 and the core logic circuits 502. Data signals Data1-8 and clock signals Clk1-8 may be transmitted from the core logic circuits 502 to UFI logic circuit 501. UFI logic circuit 501 can phase shift the clock signal to be transmitted to each of the IO lanes to align with the data signals to be transmitted to the same IO lane. For example, UFI logic circuit 501 may contain registers that delay clock signals Clk1, Clk2, Clk3, Clk4, Clk5, Clk6 Clk7, and Clk8 to be phase aligned with data signals Data1, Data2, Data3, Data4, Data5, Data6, Data7, and Data 8, respectively. UFI logic circuit 501 transmits the data signals Data1-8 and phase aligned clock signals Clk1-8 to the 8 groups 111-118 of IO driver circuits as signals Clk1/Data1, Clk2/Data2, Clk3/Data3, Clk4/Data4, Clk5/Data5, Clk6/Data6, Clk7/Data7, and Clk8/Data8, respectively. The IO driver circuits in groups 111-118 may transmit the data and/or clock signals received from UFI logic circuit 501 to one or more external devices through external terminals in groups 101-108, respectively.

Figure 6:
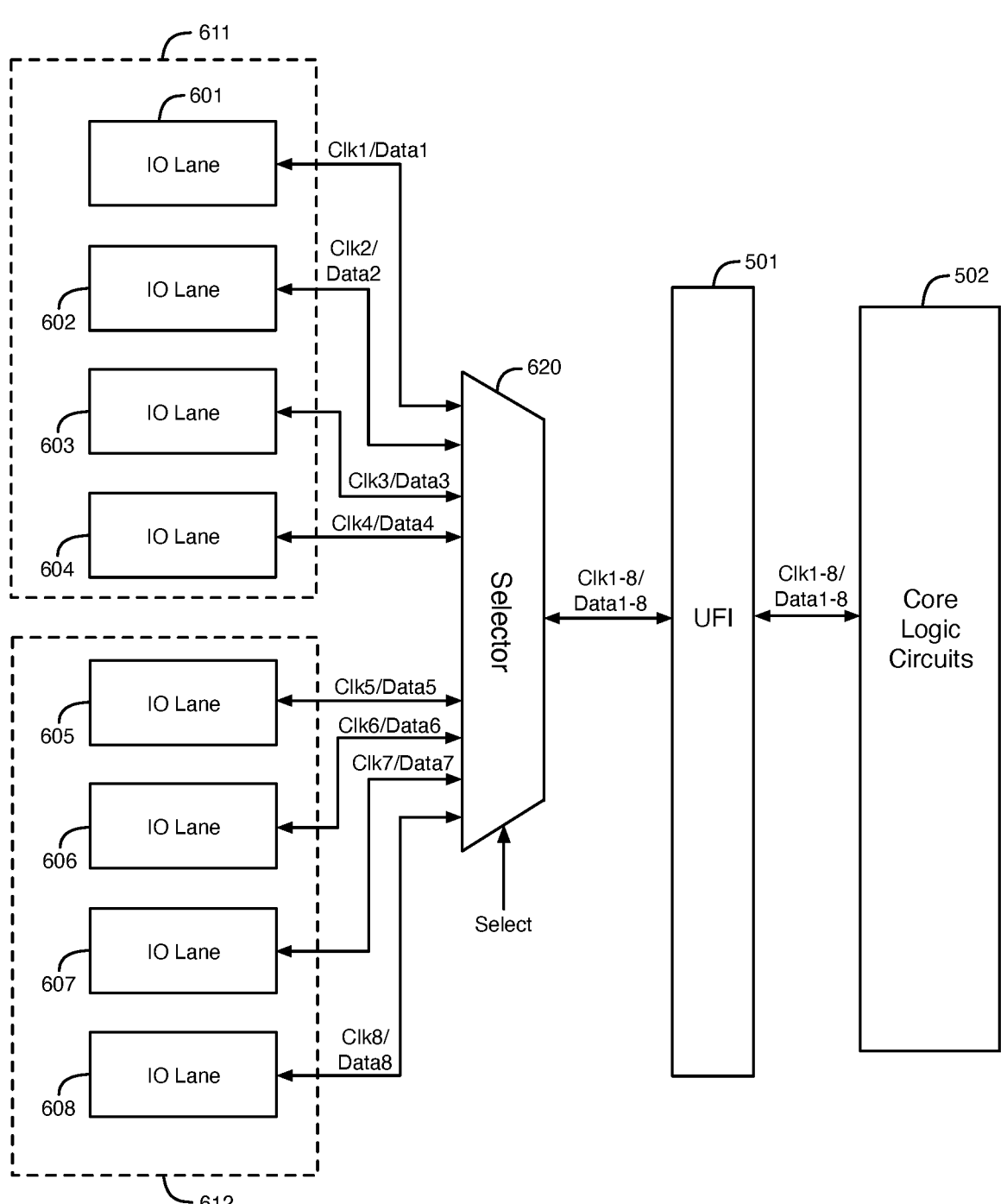
FIG. 6 is a diagram that illustrates an example of a selector circuit that can interface between IO lanes in one or more IO banks and the unified fabric interface (UFI) logic circuit of FIG. 5.

FIG. 6 is a diagram that illustrates an example of a selector circuit 620 that can interface between IO lanes in one or more IO banks and the unified fabric interface (UFI) logic circuit 501 of FIG. 5. FIG. 6 illustrates 8 IO lanes 601-608 that may be part of one or more IO banks. IO lanes 601-604 are part of a first sub-bank 611 of an IO bank. IO lanes 605-608 are part of a second sub-bank 612 of an IO bank. IO lanes 601-608 generate 8 sets of clock and data signals Clk1/Data1, Clk2/Data2, Clk3/Data3, Clk4/Data4, Clk5/Data5, Clk6/Data6, Clk7/Data7, and Clk8/Data8, respectively, that are transmitted to inputs of selector circuit 620. Selector circuit 620 receives Select signals, for example, from a controller circuit or from software. Selector circuit 620 may be configured as a multiplexer by the Select signals to transmit the clock signals Clk1-8 and data signals Data1-8 to UFI logic circuit 501 through selected bus lines. The Select signals may cause the selector circuit 620 to transmit signals from the IO lanes that are part of an external interface to the UFI circuit 501 through bus lines designated for the external interface. For example, if IO lanes 601-606 are part of a first external interface (e.g., a DDR memory interface), and IO lanes 607-608 are part of a second external interface (e.g., a GPIO interface), then the selector circuit 620 may be configured to transmit signals Clk1/Data1-Clk2/Data6 to UFI circuit 501 through bus lines designated for the first external interface, and selector circuit 620 may be configured to transmit signals Clk7/Data7-Clk8/Data8 to UFI circuit 501 through bus lines designated for the second external interface. UFI logic circuit 501 transmits the phase aligned clock signals Clk1-8 and data signals Data1-8 to core logic circuits 502.

Data signals and clock signals Clk1-8/Data1-8 may be transmitted from the core logic circuits 502 to selector circuit 620 through the UFI logic circuit 501 for the IO lanes in sub-banks 611-612. Selector circuit 620 may be configured as a demultiplexer by the Select signals to transmit the clock signals and data signals for an external interface from UFI logic circuit 501 to the IO lanes in sub-banks 611-612 that are part of that external interface. For example, if IO lanes 603-607 are part of a first external interface, then selector circuit 620 may be configured to transmit clock and data signals Clk3/Data3-Clk7/Data7 for the first external interface from UFI circuit 501 to IO lanes 603-607, respectively. If IO lanes 601-602 are part of a second external interface, then selector circuit 620 may be configured to transmit clock and data signals Clk1/Data1-Clk2/Data2 for the second external interface from UFI circuit 501 to IO lanes 601-602, respectively. If IO lane 608 is part of a third external interface, then selector circuit 620 may be configured to transmit clock and data signals Clk8/Data8 for the third external interface from UFI circuit 501 to IO lane 608.

Figure 7:
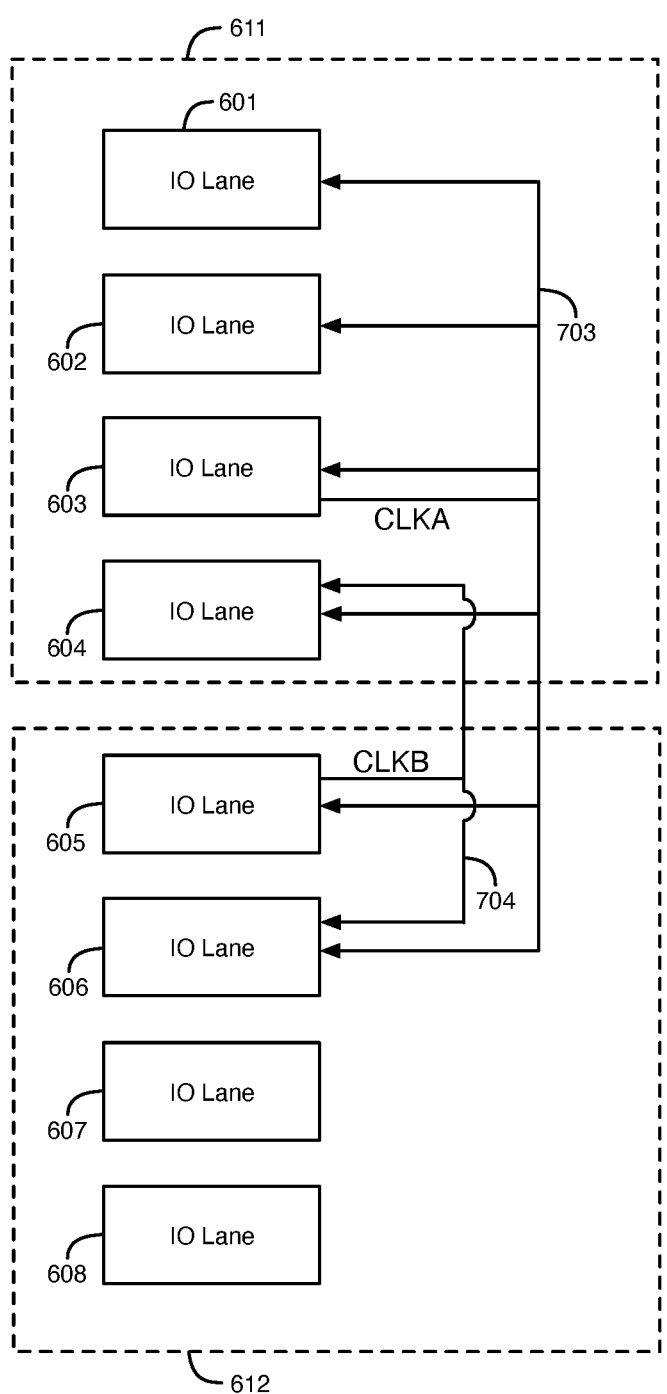
FIG. 7 is a diagram that illustrates examples of clock networks that are used to transmit clock signals to IO lanes in sub-banks.

FIG. 7 is a diagram that illustrates examples of clock networks that are used to transmit clock signals to IO lanes in sub-banks. FIG. 7 illustrates the 4 IO lanes 601-604 in sub-bank 611 and the 4 IO lanes 605-608 in sub-bank 612 that are shown in FIG. 6. In the example of FIG. 7, IO lanes 601-606 are part of a first external interface (e.g., a DDR memory interface) that supports sharing between sub-banks 611-612, and IO lanes 607-608 are part of a second external interface (e.g., a GPIO interface). IO lane 603 outputs a first clock signal CLKA that is transmitted through a first balanced clock network 703 to each of the IO lanes 601-606 in the first external interface. IO lane 603 may, for example, generate clock signal CLKA with a clock data recovery circuit, a phase-locked loop circuit, or a buffer or driver circuit. Because the first clock network 703 is balanced, each of the IO lanes 601-606 receives the clock signal CLKA having the same delay.

As another example, IO lanes 601-608 may have a different configuration for a different external interface that supports sharing between sub-banks 611-612. In another configuration, IO lane 605 outputs a second clock signal CLKB that is transmitted through a second balanced clock network 704 to IO lanes 604-606 in another external interface. IO lane 605 may, for example, generate the clock signal CLKB with a clock data recovery circuit, a phase-locked loop circuit, or an buffer or driver circuit. Because the second clock network 704 is balanced, each of the IO lanes 604-606 receives the clock signal CLKB having the same delay. Each of the clock networks 703-704 may include circuits that are configurable to cause the clock networks 703-704 to be balanced for the IO lanes in an external interface in order to provide the same delay to the clock signals as received at the IO lanes.

Figure 8:
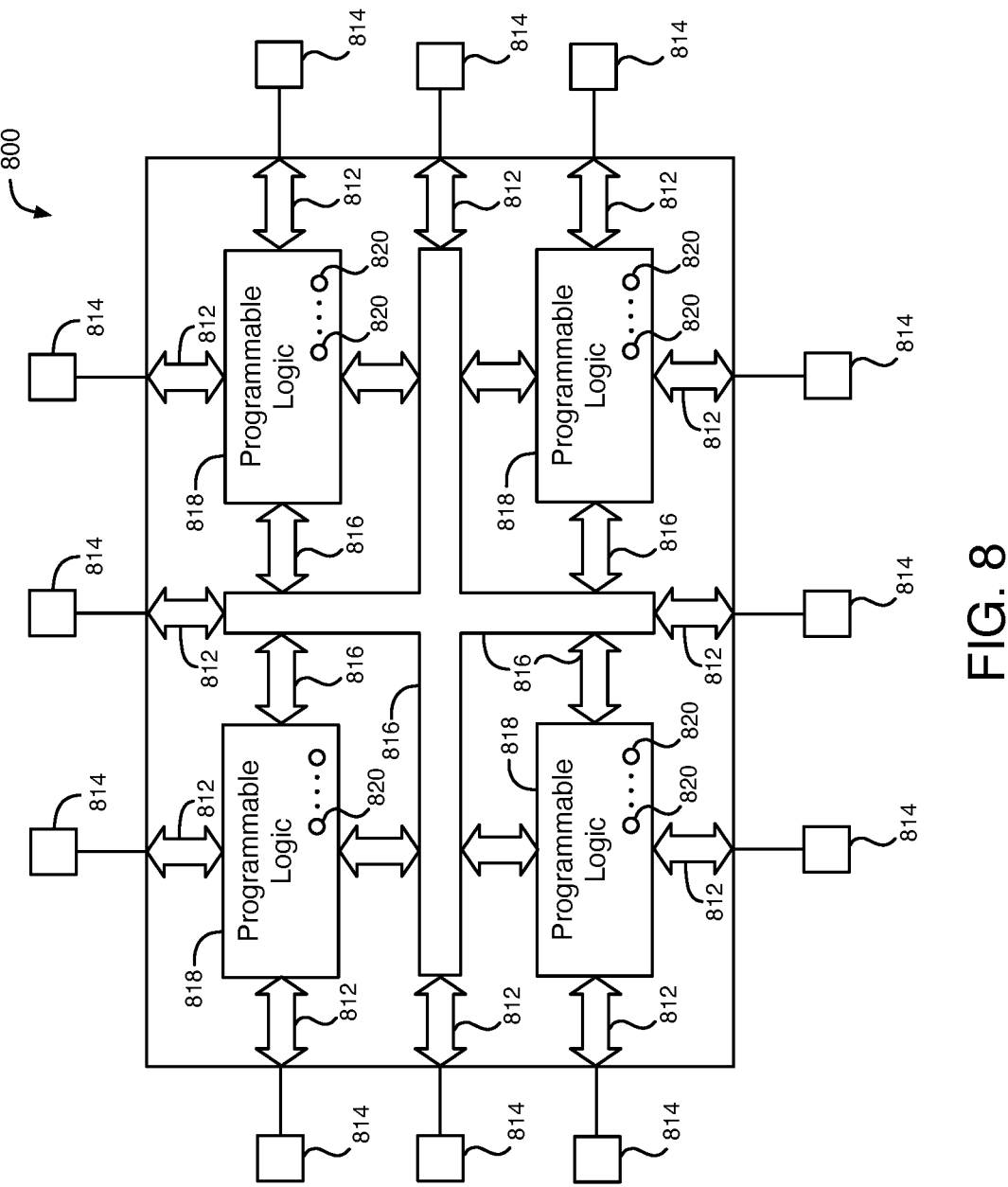
FIG. 8 is an example of a programmable logic IC.

An illustrative programmable logic integrated circuit (IC) 800 is shown in FIG. 8. As shown in FIG. 8, programmable logic integrated circuit 800 may have input/output (IO) circuitry 812 for driving signals off of IC 800 and for receiving signals from other devices via input-output pads 814. IO circuitry 812 may include any of the IO banks, sub-banks, and IO lanes disclosed herein. Each of the IO banks may receive supply current from a separate supply voltage. Interconnection resources 816 such as global, regional, and local vertical and horizontal conductive lines and buses may be used to route signals on IC 800. Interconnection resources 816 include fixed interconnects (conductive lines) and programmable interconnects (i.e., programmable connections between respective fixed interconnects). Programmable logic circuitry 818 may include combinational and sequential logic circuitry. The programmable logic circuitry 818 may be configured to perform custom logic functions.

Programmable logic IC 800 contains memory elements 820 that can be loaded with configuration data (also called programming data) using pads 814 and input-output circuitry 812. Once loaded, the memory elements 820 may each provide a corresponding static control output signal that controls the state of an associated logic component in programmable logic circuitry 818. Typically, the memory element output signals are used to control the gates of metal-oxide-semiconductor (MOS) transistors.

In general, software and data for performing any of the functions disclosed herein may be stored in non-transitory computer readable storage media. Non-transitory computer readable storage media is tangible computer readable storage media that stores data for a significant period of time, as opposed to media that only transmits propagating electrical signals (e.g., wires). The software code may sometimes be referred to as software, data, program instructions, instructions, or code. The non-transitory computer readable storage media may include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

Additional examples are now described. Example 1 is an integrated circuit comprising: a first input/output lane comprising first external terminals and first driver circuits, wherein the first driver circuits exchange signals with a first external device through the first external terminals as part of a first external interface, and wherein the first input/output lane is part of a first sub-bank that implements at least a part of the first external interface in a first input/output bank; and a second input/output lane comprising second external terminals and second driver circuits, wherein the second driver circuits exchange signals with a second external device through the second external terminals as part of a second external interface, and wherein the second input/output lane is part of the first sub-bank that implements at least a part of the second external interface in the first input/output bank.

In Example 2, the integrated circuit of Example 1 may further comprise: a third input/output lane comprising third external terminals and third driver circuits, wherein the third driver circuits exchange signals with the second external device through the third external terminals as part of the second external interface, and wherein the third input/output lane is part of the first sub-bank in the first input/output bank.

In Example 3, the integrated circuit of Example 2 may further comprise: a fourth input/output lane comprising fourth external terminals and fourth driver circuits, wherein the fourth driver circuits exchange signals with the first external device through the fourth external terminals as part of the first external interface, and wherein the fourth input/output lane is part of the first sub-bank in the first input/output bank.

In Example 4, the integrated circuit of Example 1 may further comprise: a third input/output lane comprising third external terminals and third driver circuits, wherein the third driver circuits exchange signals with the second external device through the third external terminals as part of the second external interface, and wherein the third input/output lane is part of a second sub-bank in a second input/output bank.

In Example 5, the integrated circuit of any one of Examples 1~4 may optionally include, wherein the first and the second external interfaces are memory interfaces, and wherein the first and the second external devices are memory devices.

In Example 6, the integrated circuit of any one of Examples 1-5 may further comprise: a unified fabric interface circuit that phase aligns a clock signal received from the first input/output lane with a data signal received from the first input/output lane.

In Example 7, the integrated circuit of any one of Examples 1-6 may further comprise: logic circuits in a core logic region of the integrated circuit; and a selector circuit that is configurable to provide signals from the first and the second input/output lanes to the logic circuits.

In Example 8, the integrated circuit of Example 7 may optionally include, wherein the selector circuit is configurable to provide signals from the logic circuits to the first and the second input/output lanes.

In Example 9, the integrated circuit of Example 4 may further comprise: a clock network that provides a clock signal from the second input/output lane to each of the second and the third input/output lanes.

Example 10 is a method for sharing a first sub-bank in a first input/output bank with first and second external interfaces, the method comprising: implementing a first input/output lane in the first sub-bank as at least a part of the first external interface to exchange signals with a first external device through first external terminals using first driver circuits in the first input/output lane; and implementing a second input/output lane in the first sub-bank as at least a part of the second external interface to exchange signals with a second external device through second external terminals using second driver circuits in the second input/output lane, wherein the first input/output bank is in an integrated circuit.

In Example 11, the method of Example 10 may further comprise: implementing a third input/output lane in the first sub-bank as at least a part of the second external interface to exchange signals with the second external device through third external terminals using third driver circuits in the third input/output lane.

In Example 12, the method of Example 11 may further comprise: implementing a fourth input/output lane in the first sub-bank as at least a part of the first external interface to exchange signals with the first external device through fourth external terminals using fourth driver circuits in the fourth input/output lane.

In Example 13, the method of Example 10 may further comprise: implementing a third input/output lane as at least a part of the second external interface to exchange signals with the second external device through third external terminals using third driver circuits in the third input/output lane, wherein the third input/output lane is part of a second sub-bank in a second input/output bank, and wherein the second input/output bank is in the integrated circuit.

In Example 14, the method of any one of Examples 10-13 may further comprise: phase aligning a clock signal received from the first input/output lane with a data signal received from the first input/output lane at a unified fabric interface circuit.

In Example 15, the method of any one of Examples 10-14 may further comprise: configuring a selector circuit to provide signals from the first and the second input/output lanes to logic circuits in a core logic region of the integrated circuit.

In Example 16, the method of Example 15 may further comprise: configuring the selector circuit to provide signals from the logic circuits to the first and the second input/output lanes.

In Example 17, the method of Example 13 may further comprise: configuring a clock network to provide a clock signal from the second input/output lane to each of the second and the third input/output lanes.

In Example 18, the method of any one of Examples 10-17 may further include: providing supply current to each of the first input/output lane and the second input/output lane from a supply voltage.

Example 19 is an integrated circuit package comprising: first and second integrated circuits; and a third integrated circuit comprising a first input/output lane comprising first external terminals and first driver circuits, wherein the first input/output lane is part of a sub-bank in an input/output bank, wherein the first input/output lane implements at least a part of a first external interface, wherein the first driver circuits exchange signals with the first integrated circuit through the first external terminals, wherein the third integrated circuit further comprises a second input/output lane comprising second external terminals and second driver circuits, wherein the second input/output lane is part of the sub-bank in the input/output bank, wherein the second input/output lane implements at least a part of a second external interface, and wherein the second driver circuits exchange signals with the second integrated circuit through the second external terminals.

In Example 20, the integrated circuit package of Example 19 may optionally include, wherein the third integrated circuit further comprises a third input/output lane comprising third external terminals and third driver circuits, wherein the third input/output lane is part of the sub-bank in the input/output bank, and wherein the third driver circuits exchange signals with the second integrated circuit through the third external terminals as part of the second external interface.

The foregoing description of the examples has been presented for the purpose of illustration. The foregoing description is not intended to be exhaustive or to be limiting to the examples disclosed herein. In some instances, various features can be employed without a corresponding use of other features as set forth. Many modifications, substitutions, and variations are possible in light of the above teachings, without departing from the scope of the examples.

What is claimed is:

1. An integrated circuit comprising:
a first input/output lane comprising first external terminals and first driver circuits, wherein the first driver circuits transmit first output signals to a first external device through the first external terminals as part of a first external interface in a first input/output bank, and wherein the first input/output lane is part of a first sub-bank of the first input/output bank that implements at least a part of the first external interface; and
a second input/output lane comprising second external terminals and second driver circuits, wherein the second driver circuits transmit second output signals to a second external device through the second external terminals as part of a second external interface in the first input/output bank, wherein the second input/output lane is part of the first sub-bank that implements at least a part of the second external interface, and wherein the first sub-bank of the first input/output bank is shared between the first external interface that transmits the first output signals to the first external device and the second external interface that transmits the second output signals to the second external device.

2. The integrated circuit of claim 1 further comprising:
a third input/output lane comprising third external terminals and third driver circuits, wherein the third driver circuits transmit third output signals to the second external device through the third external terminals as part of the second external interface, and wherein the third input/output lane is part of the first sub-bank in the first input/output bank.

3. The integrated circuit of claim 2 further comprising:

a fourth input/output lane comprising fourth external terminals and fourth driver circuits, wherein the fourth driver circuits transmit fourth output signals to the first external device through the fourth external terminals as part of the first external interface, and wherein the fourth input/output lane is part of the first sub-bank in the first input/output bank.

4. The integrated circuit of claim 1 further comprising:

a third input/output lane comprising third external terminals and third driver circuits, wherein the third driver circuits transmit third output signals to the second external device through the third external terminals as part of the second external interface, and wherein the third input/output lane is part of a second sub-bank in a second input/output bank.

5. The integrated circuit of claim 1, wherein the first and the second external interfaces are memory interfaces, and wherein the first and the second external devices are memory devices.

6. The integrated circuit of claim 1 further comprising:

a unified fabric interface circuit that phase aligns a clock signal received from the first input/output lane with a data signal received from the first input/output lane.

7. The integrated circuit of claim 1 further comprising:

logic circuits in a core logic region of the integrated circuit; and a selector circuit that is configurable to provide third signals from the first and the second input/output lanes to the logic circuits.

8. The integrated circuit of claim 7, wherein the selector circuit is configurable to provide fourth signals from the logic circuits to the first and the second input/output lanes.

9. The integrated circuit of claim 4 further comprising:

a clock network that provides a clock signal from the second input/output lane to each of the second and the third input/output lanes.

10. A method for sharing a first sub-bank in a first input/output bank with first and second external interfaces, the method comprising:

implementing a first input/output lane in the first sub-bank as at least a part of the first external interface to transmit first signals to a first external device through first external terminals using first driver circuits in the first input/output lane; and implementing a second input/output lane in the first sub-bank as at least a part of the second external interface to transmit second signals to a second external device through second external terminals using second driver circuits in the second input/output lane, wherein the first input/output bank is in an integrated circuit, and wherein the first sub-bank in the first input/output bank is shared between the first external interface that transmits the first signals to the first external device and the second external interface that transmits the second signals to the second external device.

11. The method of claim 10 further comprising:

implementing a third input/output lane in the first sub-bank as at least a part of the second external interface to transmit third signals to the second external device through third external terminals using third driver circuits in the third input/output lane.

12. The method of claim 11 further comprising:

implementing a fourth input/output lane in the first sub-bank as at least a part of the first external interface to transmit fourth signals to the first external device through fourth external terminals using fourth driver circuits in the fourth input/output lane.

13. The method of claim 10 further comprising:

implementing a third input/output lane as at least a part of the second external interface to transmit third signals to the second external device through third external terminals using third driver circuits in the third input/output lane, wherein the third input/output lane is part of a second sub-bank in a second input/output bank, and wherein the second input/output bank is in the integrated circuit.

14. The method of claim 10 further comprising:

phase aligning a clock signal received from the first input/output lane with a data signal received from the first input/output lane at a unified fabric interface circuit.

15. The method of claim 10 further comprising:

configuring a selector circuit to provide third signals from the first and the second input/output lanes to logic circuits in a core logic region of the integrated circuit.

16. The method of claim 15 further comprising:

configuring the selector circuit to provide fourth signals from the logic circuits to the first and the second input/output lanes.

17. The method of claim 13 further comprising:

configuring a clock network to provide a clock signal from the second input/output lane to each of the second and the third input/output lanes.

18. The method of claim 10, wherein the first and the second external interfaces are memory interfaces, and wherein the first and the second external devices are memory devices.

19. An integrated circuit package comprising:

first and second integrated circuits; and a third integrated circuit comprising a first input/output lane comprising first external terminals and first driver circuits, wherein the first input/output lane is part of a sub-bank in an input/output bank, wherein the first input/output lane implements at least a part of a first external interface, wherein the first driver circuits transmit first signals to the first integrated circuit through the first external terminals, wherein the third integrated circuit further comprises a second input/output lane comprising second external terminals and second driver circuits, wherein the second input/output lane is part of the sub-bank in the input/output bank, wherein the second input/output lane implements at least a part of a second external interface, wherein the second driver circuits transmit second signals to the second integrated circuit through the second external terminals, and wherein the sub-bank in the input/output bank is shared between the first external interface that transmits the first signals to the first integrated circuit and the second external interface that transmits the second signals to the second integrated circuit.

20. The integrated circuit package of claim 19, wherein the third integrated circuit further comprises a third input/output lane comprising third external terminals and third driver circuits, wherein the third input/output lane is part of the sub-bank in the input/output bank, and wherein the third driver circuits transmit third signals to the second integrated circuit through the third external terminals as part of the second external interface.

* * * * *